(12) United States Patent
Yum et al.

(10) Patent No.: US 11,928,995 B2
(45) Date of Patent: Mar. 12, 2024

(54) DISPLAY TEST APPARATUS AND METHOD OF FABRICATING DISPLAY DEVICE(S)

(71) Applicant: SAMSUNG ELECTRONICS CO., LTD., Suwon-si (KR)

(72) Inventors: Joo Hyuk Yum, Yongin-si (KR); Deok Soo Park, Hwaseong-si (KR); Byoung-Ju Song, Gwangju (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 17/581,234

(22) Filed: Jan. 21, 2022

(65) Prior Publication Data

US 2022/0398955 A1     Dec. 15, 2022

(30) Foreign Application Priority Data

Jun. 14, 2021   (KR) .......................... 10-2021-0076660

(51) Int. Cl.
*G09G 3/00* (2006.01)
*H01L 51/56* (2006.01)
*H10K 71/00* (2023.01)

(52) U.S. Cl.
CPC ............. *G09G 3/006* (2013.01); *H10K 71/00* (2023.02); *G09G 2320/0242* (2013.01)

(58) Field of Classification Search
None
See application file for complete search history.

(56) References Cited

U.S. PATENT DOCUMENTS

| | | | |
|---|---|---|---|
| 8,731,288 B2 | 5/2014 | Tsukada | |
| 9,386,189 B2 | 7/2016 | Choi et al. | |
| 9,401,106 B2 | 7/2016 | Choi | |
| 9,557,459 B2 | 1/2017 | Huang et al. | |
| 9,659,388 B1 | 5/2017 | Safaee-Rad et al. | |
| 9,854,136 B2 | 12/2017 | Doser et al. | |
| 10,861,416 B2 | 12/2020 | Kim et al. | |
| 2012/0169719 A1* | 7/2012 | Kim | H04N 13/324 345/419 |
| 2018/0018793 A1* | 1/2018 | Min | H04N 1/60 |

FOREIGN PATENT DOCUMENTS

KR    20110061947 A    6/2011

* cited by examiner

*Primary Examiner* — Jermele M Hollington
*Assistant Examiner* — Haidong Zhang
(74) *Attorney, Agent, or Firm* — Fish & Richardson P.C.

(57) ABSTRACT

A display test apparatus includes a measuring apparatus and a calculating device connected to the measuring apparatus. The measuring apparatus provides a sample pixel value to a first display device including a first display panel, measures a first color coordinate value of an image displayed by the first display panel in response to the sample pixel value. The calculating device generates a first parameter of the first display panel in response to the first color coordinate value, generates a target color coordinate value in response to the sample pixel value, and generates a first mapping table in response to the first color coordinate value, the first parameter and the target color coordinate value.

20 Claims, 22 Drawing Sheets

DISPLAY TEST APPARATUS AND METHOD OF FABRICATING DISPLAY DEVICE(S)

This application claims priority under 35 U.S.C. § 119 from Korean Patent Application No. 10-2021-0076660 filed on Jun. 14, 2021 in the Korean Intellectual Property Office, the subject matter of which is hereby incorporated by reference in its entirety.

BACKGROUND

1. Field of the Invention

The inventive concept relates generally to display test apparatus(es) and method(s) of fabricating a display device.

2. Description of the Related Art

Display devices, such as for example the liquid crystal display (LCD) and the organic light emitting display (OLED) have been widely incorporated within a variety of electronic devices, such as for example televisions (TV), personal computers (PC), laptop PCs, monitors, mobile devices, etc. In many contemporary and emerging electronic devices, an OLED display panel has been used.

Performance of an OLED display panel may be characterized in terms of a color gamut. In this regard, the term "color gamut" refers to a spectrum of colors that an electronic device may faithfully reproduce on an associated display. The color gamut of an OLED display panel may be different from a standard color gamut, and each OLED display panel may have a different color gamut. Recently, performance requirements for color accuracy of OLED display panels have increased. Therefore, it is essential to correct the color gamut of a display device including an OLED display panel.

SUMMARY

Aspects of the inventive concept provide a display test apparatus capable of generating a mapping table for correcting the color gamut of a display device.

Aspects of the inventive concept also provide a display test apparatus that reduces correction time associated with the color gamut of a display device.

Aspects of the inventive concept also provide a method of fabricating a display device that generates a mapping table for correcting the color gamut of a display device.

Aspects of the inventive concept also provide a method of fabricating a display device that reduces correction time of the color gamut of the display device.

However, aspects of the inventive concept are not restricted to the one set forth herein, and those skilled in the art will appreciate other aspects of the inventive concept upon consideration of the following detailed description together with the accompanying drawings.

According to an embodiment of the inventive concept, the display test apparatus includes; a measuring apparatus configured to accommodate a first display device including a first display panel and a second display device including a second display panel, and a calculating device connected to the measuring apparatus. The measuring apparatus is further configured to provide a sample pixel value to the first display device and the second display device, measure a first color coordinate value associated with a first display image of the first display panel in response to the sample pixel value, and measure a second color coordinate value associated with a second display image of the second display panel in response to the sample pixel value, and the calculating device is further configured to generate a first parameter of the first display panel in response to the first color coordinate value, generate a second parameter, different from the first parameter, of the second display panel in response to the second color coordinate value, generate a target color coordinate value in response to the sample pixel value, generate a first mapping table in response to the first color coordinate value, the first parameter and the target color coordinate value, and generate a second mapping table, different from the first mapping table, in response to the second color coordinate value, the second parameter, and the target color coordinate value.

According to an embodiment of the inventive concept, a method of fabricating a display device includes; providing a sample pixel value to a display device including an organic light emitting display (OLED) panel, measuring a color coordinate value of a display image generated by the OLED in response to the sample pixel value, generating at least one parameter of the OLED panel in response to the color coordinate value, generating a target color coordinate value in response to the sample pixel value, calculating a target voltage in response to the target color coordinate value and the at least one parameter, wherein the target color coordinate value is included in a standard color gamut, and generating a mapping table in response to the color coordinate value, the at least one parameter, and the target voltage.

According to an embodiment of the inventive concept, a method of fabricating a first display device including a first display panel and a second display device including a second display panel includes; during a first time period, providing a first stage of the first display device using a first display process apparatus, testing the first stage of the first display device, and then, providing a final stage of the first display device using a second display process apparatus, and during a second time period following the first time period, providing a first stage of the second display device using the first display process apparatus, testing the first stage of the second display device, and then, providing a final stage of the second display device using a second display process apparatus. The testing of the first stage of the first display device includes; providing a first sample pixel value to the first stage of the first display device, measuring a first color coordinate value of an image displayed by the first display panel in response to the first sample pixel value, providing the first color coordinate value to the first stage of the first display device, generating a first parameter of the first display panel based on the first color coordinate value, generating a first target color coordinate value based on the first sample pixel value, and generating a first mapping table based on the first color coordinate value, the first parameter, and the first target color coordinate value, and the testing of the first stage of the second display device includes; providing a second sample pixel value to the first stage of the second display device, measuring a second color coordinate value of an image displayed by the second display panel in response to the second sample pixel value, providing the second color coordinate value to the first stage of the second display device, generating a second parameter of the second display panel based on the second color coordinate value, generating a second target color coordinate value based on the second sample pixel value, and generating a second mapping table based on the second color coordinate value, the second parameter, and the second target color coordinate value.

BRIEF DESCRIPTION OF THE DRAWINGS

The making and use of the inventive concept will become more apparent to those skilled in the art upon consideration of the following detailed description together with the accompanying drawings, in which:

FIGS. 10, 11, 12 and 13 collectively illustrate the generation of a mapping table MT by a display test apparatus according to embodiments of the inventive concept, wherein FIG. 10 is a block diagram illustrating the display test apparatus, FIG. 11 is a flowchart illustrating operation of the display test apparatus of FIG. 10, FIG. 12 is a block diagram further illustrating the calculating device of FIG. 10, and FIG. 13 is a conceptual diagram illustrating a color coordinate correction;

DETAILED DESCRIPTION

Throughout the written description and drawings. like reference numbers and labels are used to denote like or similar elements, components, features and/or methos steps.

Figure 2:
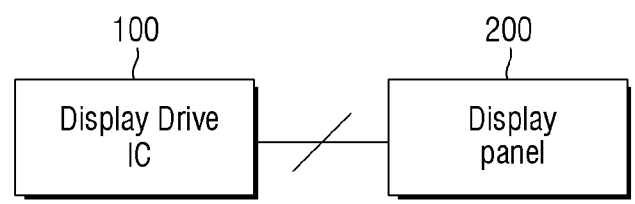
FIGS. 2 and 3 are respective block diagrams further illustrating the display device 10 of FIG. 1.
Figure 3:
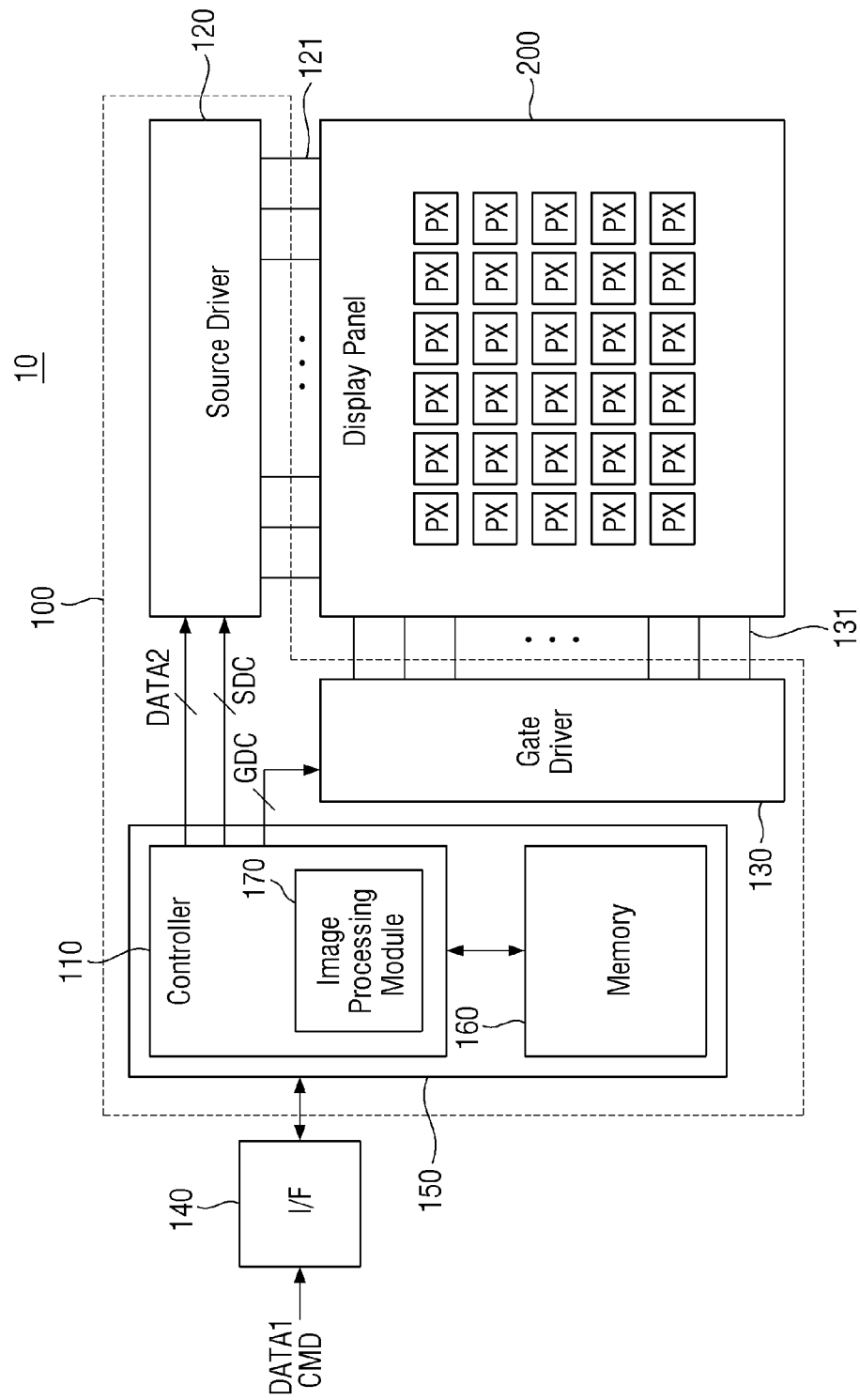

Figure (FIG.) 1 is a block diagram of an electronic device 1 including a display device 10 according to embodiments of the inventive concept, and FIGS. 2 and 3 are respective block diagrams illustrating the display device 10.

Figure 1:
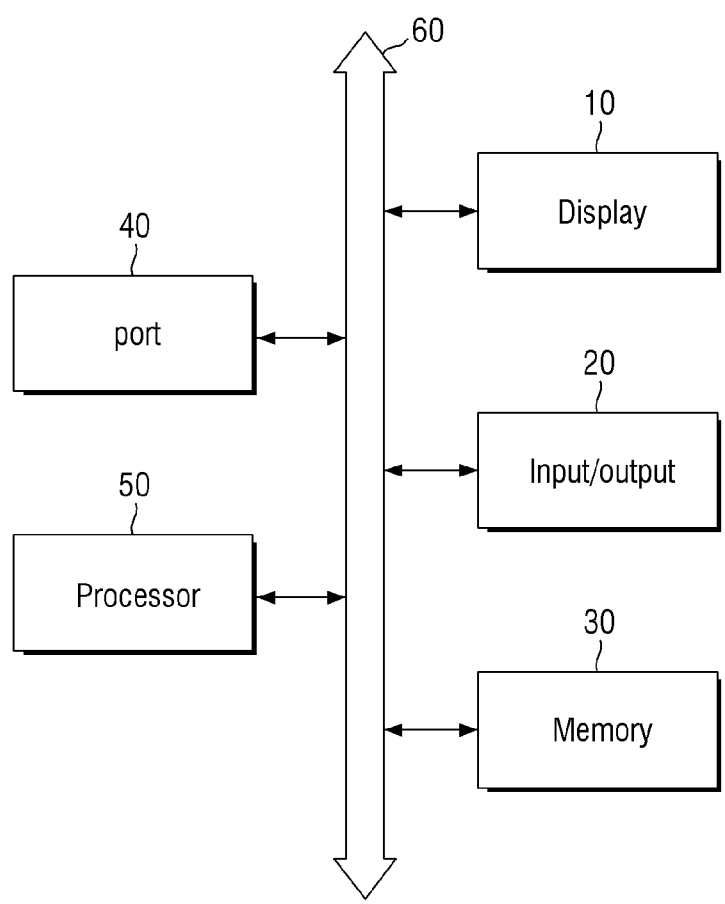
FIG. 1 is a general block diagram illustrating an electronic device including a display device according to embodiments of the inventive concept.

Referring to FIG. 1, the electronic device 1 may include in addition to the display device 10, an input/output (I/O) unit 20, a memory 30, a port 40 and a processor 50 (e.g., an application processor), variously interconnected by a bus 60. Here, the electronic device 1 may be a TV, a PC, a laptop PC, a tablet PC, or a mobile device such as a smartphone, for example.

Referring to FIG. 2, the display device 10 may generally include a display driver integrated circuit (IC) (or display drive IC (DDI)) 100 and a display panel 200. In some embodiments, the display driver 100 may further process image data received from the processor 50 via the bus 60 depending on an operating mode of the display panel 200.

For example, the display driver 100 may generate a number of gamma voltages corresponding to a number of image data bits communicated by the processor 50, select some of the gamma voltages in accordance with the image data, and input the image data to unit buffers. In some embodiments, two or more gamma voltages having different magnitudes may be input to input ports associated with unit buffers in order to generate a gradation voltage of predetermined range.

Referring to FIGS. 2 and 3, the display drive 100 may control operation of the display panel 200. Here, the display panel 200 may include one or more of an OLED, a LCD, a micro LED, a plasma display panel (PDP), an electrochromic display (ECD), a digital mirror device (DMD), an actuated mirror device (AMD), a grating light value (GLV), and an electro luminescent display (ELD). Hereinafter, however, it will be assumed for purposes of descriptive consistency that the display device 10 is an OLED, but the inventive concept are not limited thereto.

In the illustrated example of FIG. 3, the display drive device 100 includes a display drive controller 150, a source driver 120 and a gate driver 130.

The display drive controller 150 may receive externally-provided first image data DATA1 and a corresponding command CMD from a host (e.g., processor 50) through an interface (I/F) circuit 140. Following processing of the first image data DATA1, the display drive controller 150 may provide the source driver 120 and the gate driver 130 with second image data DATA2, as well as a source control signal SDC and a gate control signal GDC. Here, the second image data DATA2 may be data obtained by a conversion of the first image data DATA1. That is, an image processing module 170 of a controller 110 of the display drive controller 150 may generate the second image data DATA2 from the first image data DATAL. Accordingly, the second image data DATA2 may correspond to specialized data associated with the display panel 200.

A memory 160 associated with the display drive controller 150 may be (e.g.,) a frame memory. Those skilled in the art will also recognize that the display drive controller 150 may further include an one or more image processing unit(s), a memory controller, a command free buffer, a command register, a command sync controller, etc.

The display panel 200 of FIG. 3 includes a number of gate lines 131 configured to transmit a scan signal in a row direction. The display panel 200 also includes a number of source lines 121 intersecting the gate lines 131 and configured to transmit data signals in a column direction. Accordingly, a number of pixels PX may be arranged in regions of intersection for the gate lines 131 and the source lines 121.

Assuming that the gate lines 131 are selected in a defined sequence, a gradation voltage may be applied to the pixels PX connected to the selected gate lines 131 through the source lines 121.

In some embodiments, each of the pixels PX may include a switching transistor, a drive transistor, a storage capacitor, and an organic light emitting diode. The gate lines 131 and the source lines 121 may be connected to the pixels PX.

A source driver 120 may be used to convert the second image data DATA2 received from the display drive controller 150 into a gradation voltage, and may then apply the gradation voltage to the display panel 200 through the source lines 121. The gate driver 130 may scan the gate lines 131 in sequence. The gate driver 130 applies a gate-ON voltage to a sequentially selected gate line 131 among the gate lines 131 to activate the selected gate line 131, and the source driver 120 may output the gradation voltage corresponding to the pixels PX connected to the activated gate line 131.

Accordingly, images may be displayed on the display panel 200 in units of horizontal lines (e.g., on a line-by-line basis).

The display device 10 may communicate with the host through the interface circuit 140. That is, the interface circuit 140 may receive the first image data DATA1 and the command CMD applied in parallel or serially from the host, and provide same to the display drive controller 150. The first image data DATA1 and the command CMD may be communicated from a host of an electronic device incorporating the display device 10.

In this regard, the interface circuit 140 may receive data DATA and/or commands CMD according to one or more interface protocols compatible with the host. For example, the interface circuit 140 may use a Red-Green-Blue (RGB) interface, a Central Processing Unit (CPU) defined interface, a Provider Service Interface (PSI), a Mobile Display Digital Interface (MDDI), a Mobile Industry Processor Interface (MIPI), etc.

The display drive controller 150, including the controller 110 and the memory 160, may be used to generate the source control signal SDC (e.g., a signal controlling the operation timing of the source driver 120) and the gate control signal GDC (e.g., a signal controlling the operation timing of the gate driver 130) in response to (e.g.,) the first image data DATA1 and the command CMD. Further, in addition to the second image data DATA2, the controller 110 may generate a mapping table stored in the memory 160, wherein the mapping table may be provided to the source driver 120.

The memory 160 may be used to temporarily store one (1) frame of the second image data DATA2 to be displayed by the display panel 200, and provide (or output) the image data DATA2 to the display panel 200. In some embodiment, the memory 160 may be implemented as a non-volatile memory. Alternately, the memory 160 may be implemented as a volatile memory, such as for example, a graphic RAM (GRAM), a static RAM (SRAM), etc.

The memory 160 may be used to store one or more mapping table(s). Thus, the memory 160 may provide a mapping table to the controller 110. In some embodiments, the mapping table may be implemented as a lookup table (LUT). However, the inventive concept is not limited thereto, and the mapping table(s) may be variously implemented.

The display drive controller 150 may control the overall operation of the memory 160, and may especially control the execution and timing of write operations and read operations performed by the memory 160.

Figure 4:
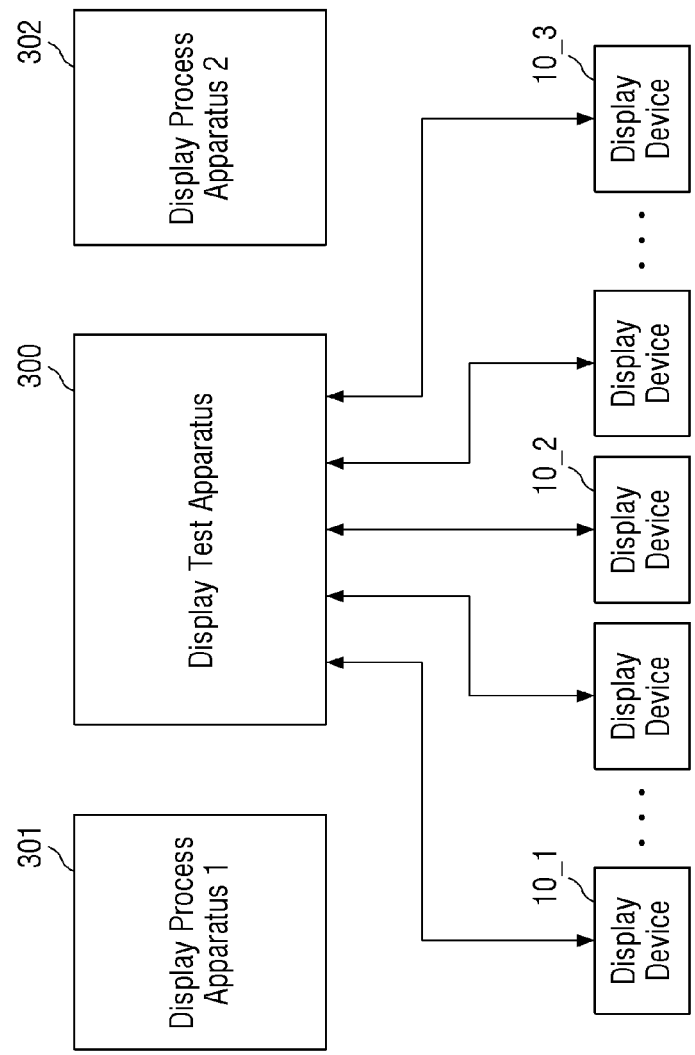
FIG. 4 is a block diagram illustrating a display test apparatus according to embodiments of the inventive concept.

FIG. 4 is a block diagram further illustrating a display test apparatus 300 according to embodiments of the inventive concept.

Referring to FIG. 4, the display test apparatus 300 may be configured to test multiple display devices 10_2. That is, the display test apparatus 300 may be configured (e.g., mechanically and/or electrically connected) to sequentially test a number of display devices 10_2. For example, the display test apparatus 300 may be used to test the display devices 10_2 during or after manufacture of the display devices 10_2. Here, each one of the display devices 10_2 may correspond to the display device 10 of FIGS. 1 and 2.

Alternately, the display test apparatus 300 may be connected to an electronic device 1 including the display device 10 in order to test the electronic device 1 or the display device 10 incorporated by the electronic device 1. In this regard, the electronic device 1 and/or the display device 10 may be tested during or after the fabrication processes used to manufacture the electronic device 1.

Thus, a first display (fabricating) process apparatus 301 and a second display (fabricating) process apparatus 302 may be usefully disposed before and after the display test apparatus 300 along an automated (or semi-automated) manufacturing line.

Accordingly, within an overall manufacturing of a display device 10-2 (or an incorporating electronic device 1), the first display process apparatus 301 may perform a first fabrication process on the display device 10_2, then the display test apparatus 300 may test the display device 102, and then the second display process apparatus 302 may perform a second fabrication process on the display device 10_2. That is, a first stage display device 10_1 may be processed by the first display process apparatus 301 to yield a testing stage display device 10_2 which is ready for testing by the display test apparatus 300. Once successful testing of the display device 10_2 is completed, the second display process apparatus 302 further processes the display device 10_2 to yield a second (or final) stage display device 10_3. Thereafter, the final stage display device 10_3 may be shipped.

Here, it should be noted that the display test apparatus 300 may be variously configured to (1) test a single display device 10_2, (2) simultaneously test a number of display devise 10_2 in parallel, and/or (3) sequentially test a number of display devices 10_2. In this regard, the sequential testing of two or more display devices 10_2 may overlap in some degree.

Figure 5:
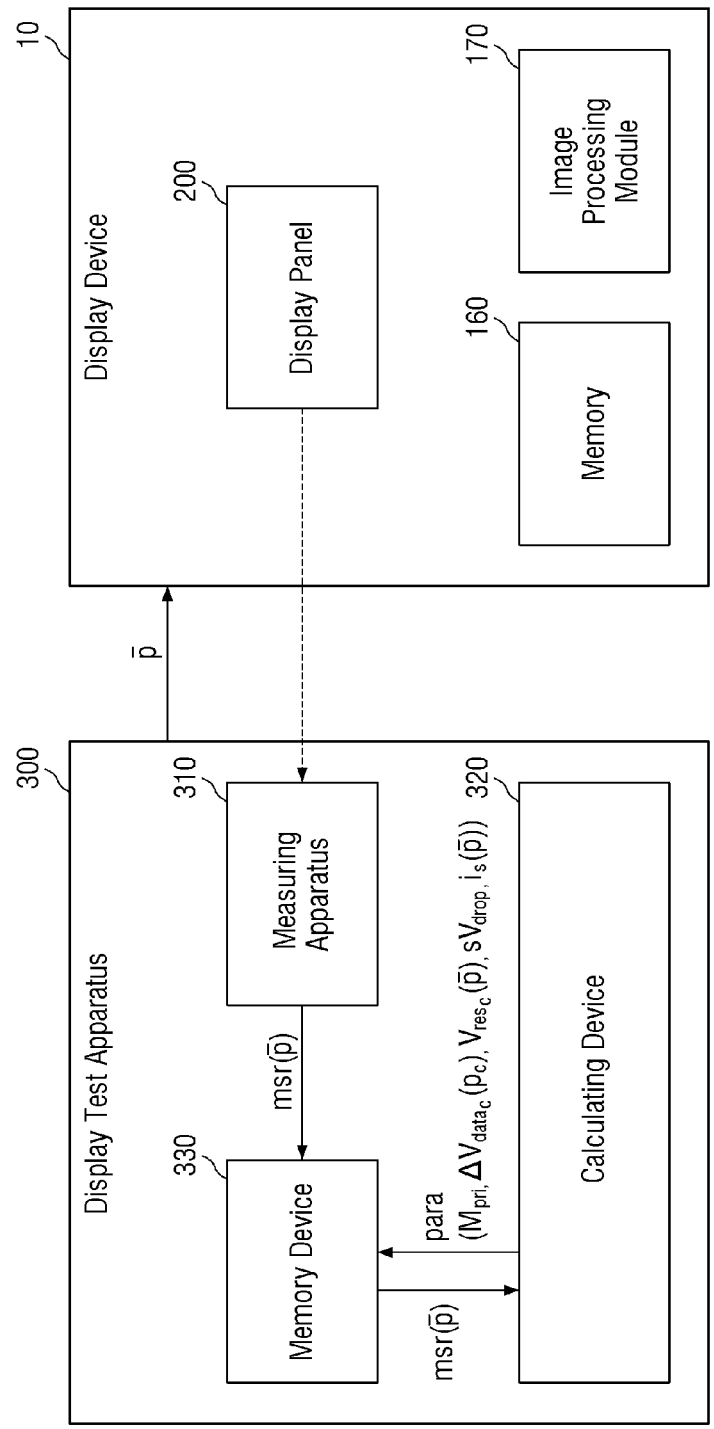
FIG. 5 is a block diagram illustrating a display test apparatus 300 of FIG. 4 testing the display device 10 of FIGS. 1, 2 and 3.
Figure 6:
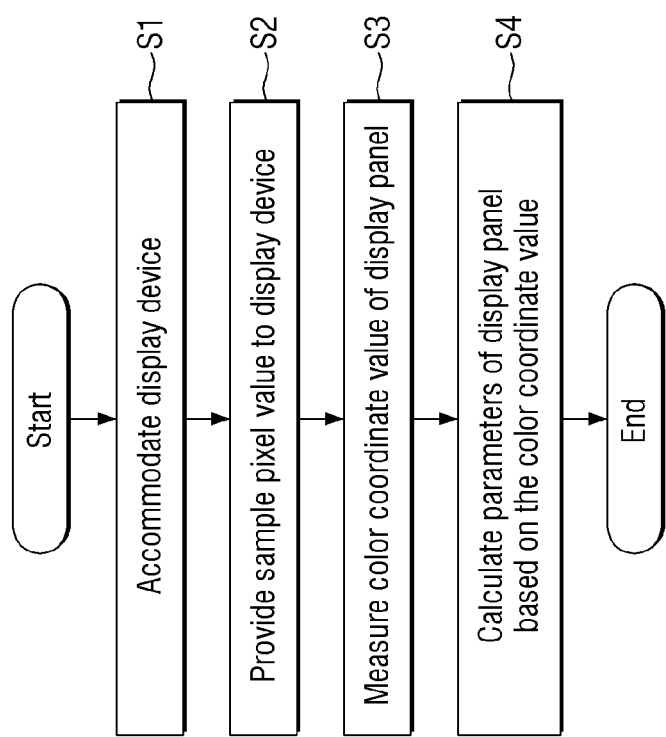
FIG. 6 is a flowchart illustrating an operating method for the display test apparatus of FIGS. 4 and 5.

FIG. 5 is a block diagram illustrating operation of the display test apparatus 300 in relation to the testing of display device 10 according to embodiments of the inventive concept, and FIG. 6 is a flowchart further illustrating a method of operation for the display test apparatus 300 of FIG. 5

Referring to FIGS. 5 and 6, the display test apparatus 300 may accommodate the display device 10 (e.g., be relatively positioned, mechanically engaged and/or electrically connected in relation to the display device 10) (S1). Once properly accommodated (e.g., along an automated or semi-automated manufacturing line), the display test apparatus 300 may be variously configured test the display device 10 in order to generate desired test data.

In this regard, the display device 10 of FIG. 5 may be the display device 10_2 following completion of the first fabrication process performed by the first display process apparatus 301. Further, the display device 10 of FIG. 5 may include the memory 160, the image processing module 170 and the display panel 200 of FIG. 3. However, the inventive concept is not limited thereto, and the display device 10 may be variously configured.

In the illustrated example of FIG. 5, the display test apparatus 300 generally includes a measuring apparatus 310, a calculating device 320, and a memory device 330. However, this is just one exemplary configuration of the display test apparatus 300 and the inventive concept are not limited thereto.

During operation of the display test apparatus 300, a sample pixel value (p̄) is provided to the display device 10

(S2). In some embodiments, the sample pixel value (p̄) may be output from the memory device 330.

Figure 7:
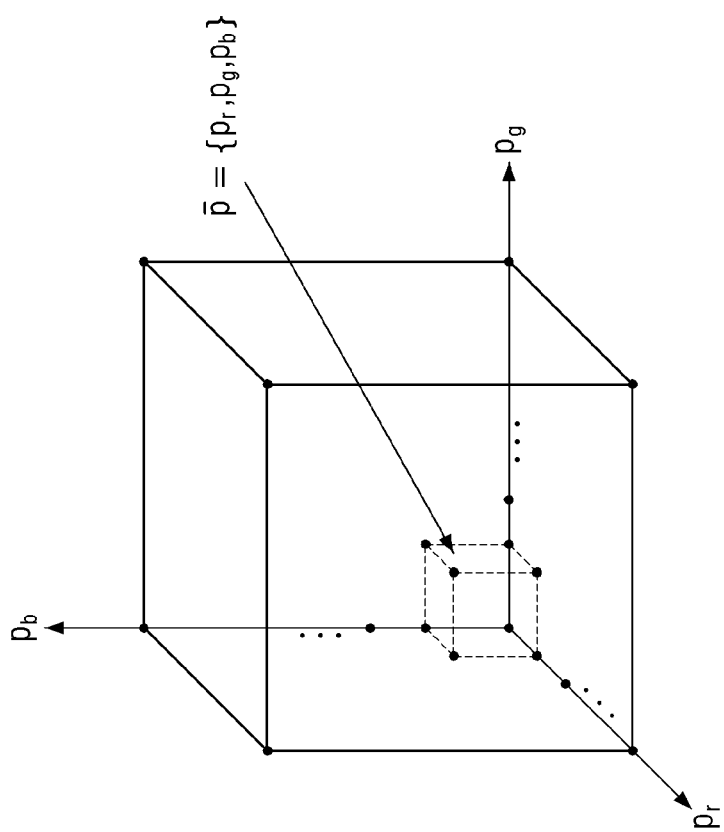
FIG. 7 is a conceptual diagram illustrating the description (or definition) of a sample pixel value.

In this regard, FIG. 7 is a conceptual diagram illustrating one possible approach to the definition and provision of the sample pixel value.

Referring to FIG. 7, the sample pixel value (p̄) may be expressed using coordinates in a RGB pixel space. For example, the sample pixel value (p̄) may be expressed by $\{p_r, p_g, P_b\}$, where $p_r$ corresponds to a red pixel component, $p_g$ corresponds to a green pixel component, and $P_b$ corresponds to a blue pixel component. In some embodiments, each of the pixel components $p_r$, $p_g$, $P_b$ may range in value between 0 and 255. Accordingly, the sample pixel value (p̄) may have values ranging from {0, 0, 0} to {255, 255, 255}. However, not all of the possible sample pixel values (p̄) need be used in embodiments of the invention concept. That is, only a limited number or a limited range of sample pixel values (p̄) may be used.

In some embodiments, the display test apparatus 300 may provide only an arbitrary sample pixel value (g) to the display device 10. Here, the sample pixel value (p̄) may correspond to the first image data DATA1 or the second image data DATA2 of FIG. 3. However, the display device 10 should be able to display an image on the display panel 200 in response to the provided sample pixel value (p̄).

Referring back to FIGS. 5 and 6, the measuring apparatus 310 of the display test apparatus 300 may provide (or measure) a measured color coordinate value msr (p̄) of the display panel 200 (S3). That is, assuming that the display device 10 outputs an image to the display panel 200 in response to the sample pixel value (p̄), the measuring apparatus 310 may visualize (or observe) and measure the image displayed by the display panel 200 using an optical device including one or more camera(s). The measured color coordinate value msr (p̄) generated in the measuring apparatus 310 may be expressed by Equation 1 below.

$$\begin{bmatrix} mX \\ mY \\ mZ \end{bmatrix} = msr(\overline{p}) \qquad \langle \text{Equation 1} \rangle$$

The measured color coordinate value msr (p̄) may include tristimulus values (tri-stimulus). For example, the measured color coordinate value msr (p̄) may include mX of red color, mY of green color, and mZ of blue color. Here, the measured color coordinate value msr (p̄) may indicate a brightness value for each color. The measuring apparatus 310 may provide the generated measured color coordinate value msr (p̄) to the memory device 330, and the memory device 330 may be used to temporarily store the measured color coordinate value msr (p̄), and provide same to the calculating device 320. However, in some embodiments, the memory device 330 may be omitted, and the measured color coordinate value msr (p̄) may be provided directly to the calculating device 320.

The calculating device 320 may calculate a parameter value (para) for the display panel 200 in response to (or on the basis of) the measured color coordinate value msr (p̄) (S4). Here, mX, mY and mZ which are the tristimulus values of the measured color coordinate values msr (p̄) may be expressed by the following Equation 2.

$$\begin{bmatrix} mX \\ mY \\ mZ \end{bmatrix} = \text{panel}(\overline{p}) = M_{pri} \times \begin{bmatrix} L_r(\overline{p}) \\ L_g(\overline{p}) \\ L_b(\overline{p}) \end{bmatrix} = \begin{bmatrix} X_r & X_g & X_b \\ Y_r & Y_g & Y_b \\ Z_r & Z_g & Z_b \end{bmatrix} \begin{bmatrix} L_r(\overline{p}) \\ L_g(\overline{p}) \\ L_b(\overline{p}) \end{bmatrix} \qquad \langle \text{Equation 2} \rangle$$

Referring to Equation 2, the measured color coordinate value msr (p̄) may be expressed according to a panel model of panel (p̄). The sample pixel value (p̄) may denote a pixel value for each channel (e.g., at least one of red color, green color and blue color). Here, $M_{pri}$ denotes the primary color characteristic of the display panel 200. For example, Xr of $M_{pri}$ may be mX when the sample pixel value (p̄) is {255, 0, 0}, Xg may be mX when the sample pixel value (p̄) is {0, 255, 0}, and Xb may be mX when the sample pixel value (p̄) is {0, 0, 255}. Further, Yr of $M_{pri}$ may be mY when the sample pixel value (p̄) is {255, 0, 0}, Yg may be mY when the sample pixel value (p̄) is {0, 255, 0}, and Yb may mY when the sample pixel value (p̄) is {0, 0, 255}. Also, Zr of $M_{pri}$ may be mZ when the sample pixel value (p̄) is {255, 0, 0}, Z. may be mZ when the sample pixel value (p̄) is {0, 255, 0}, and Zb may be mZ when the sample pixel value (p̄) is {0, 0, 255}. Here, $M_{pri}$ which is one particular parameter value (para) may be calculated using the calculating device 320. That is, the calculating device 320 may generate $M_{pri}$ in response to the measured color coordinate value msr (p̄).

Here, $L_c(\overline{p})$ may denote brightness information for the channel c. For example, $L_r(\overline{p})$ may be brightness information for the red color channel, $L_g(\overline{p})$ may be brightness information for the green color channel, and $L_b(\overline{p})$ may be brightness information for the blue color channel. That is, the measured color coordinate value msr (p̄) may be expressed by a model of $M_{pri}$ and the channel brightness information $L_c(\overline{p})$ as in Equation 2.

Figure 8:
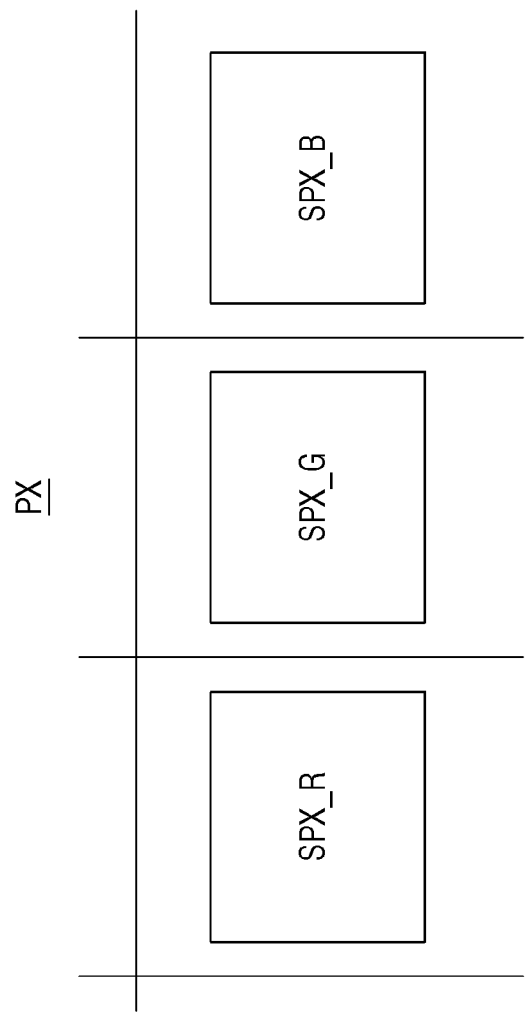
FIG. 8 is a conceptual diagram and FIG. 9 is a circuit diagram illustrating pixels that may be associated with embodiments of the inventive concept.
Figure 9:
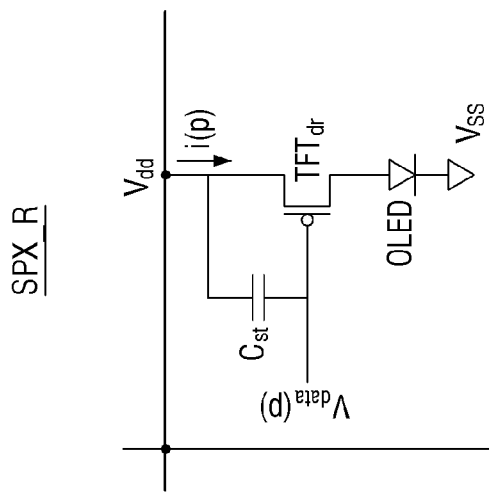

FIG. 8 is a conceptual diagram and FIG. 9 is a circuit diagram further illustrating pixels according to embodiments of the inventive concept.

Referring to FIG. 8, a pixel PX may include subpixels—e.g., a red subpixel SPX_R, a green subpixel SPX_G, and a blue subpixel SPX_B arranged in defined direction (e.g., a horizontal direction). Here, the pixel PX may correspond to the pixel PX noted in relation to the display panel 200 of FIG. 3. Accordingly, the red subpixel SPX_R, the green subpixel SPX_G, and the blue subpixel SPX_B may each be connected to a source line 121 and a gate line 131. That is, each one of the red subpixel SPX_R, the green subpixel SPX_G, and the blue subpixel SPX_B may be disposed at an intersection of a source line 121 and a gate line 131, wherein the red subpixel SPX_R may emit a red color component, the green subpixel SPX_G may emit a green color component, and the blue subpixel SPX_B may emit a blue color component.

Referring to FIG. 9, one possible configuration for the red subpixel SPX_R is further illustrated, although the green subpixel SPX_G and the blue subpixel SPX_B may be similarly configured.

The red subpixel SPX_R of FIG. 9 may include an organic light emitting diode (OLED), a transistor TFTdr, a capacitor Cst, etc. The OLED may be connected to a ground voltage Vss and a drain of the transistor TFTdr. A source of the transistor TFTdr may be connected to the source line 121. Further, a source voltage Vdd may be applied to the source of the transistor TFTdr. Also, the diode current i(p) may flow through the transistor TFTdr. The capacitor Cst may be connected between the gate and source of the transistor TFTdr. The gate of the transistor TFTdr may be connected to the gate line 131, and the input voltage Vdata(p) may be applied to the gate of the transistor TFTdr. The transistor TFTdr may operate by the diode current i(p) and the input voltage Vdata(p).

Accordingly, the OLED may operate to emit light. Operation of the red subpixel SPX_R of FIG. 9 may be expressed by Equation 3 below.

$$L(p)=\mu_{oled}\times i(p)=\mu_{oled}k(V_{dd}-V_{data}(P))^2=K(V_{dd}-V_{data}(P))^2 \quad \text{<Equation 3>}$$

Here, $\mu_{oled}$ denotes a luminous efficiency of the OLED, and k denotes a transistor parameter for the transistor TFTdr. More simply, $\mu_{oled}k$ may be expressed as K, wherein K is a constant value that has been experimentally determined.

That is, the brightness information L(p) may be expressed by the constant value K, the source voltage $V_{dd}$, and the input voltage $v_{data}(p)$. Here, two characteristics that affect the light emission of the OLED may be considered to improve the prediction accuracy of the model of the display panel 200.

First, an IR-drop generated at the source voltage $V_{dd}$ may be reflected on the model of the display panel 200. For example, $V_{dd}$ may be changed to $V_{dd}-V_{drop}$. Also, Vdrop may be expressed by $Sv_{drop}\times i_s(\overline{p})$. Here, $sV_{drop}$ denotes a slope of Vdrop, and $i_s(\overline{p})$ denotes the current flowing through the transistor TFTdr. Therefore, Vdd may be changed to $V_{dd}-sV_{drop}\times i_s(\overline{p})$.

Second, lateral leakage may be reflected on the display panel 200. Referring to FIG. 8, for example, the subpixels SPX_R, SPX_G and SPX_R may be longitudinally disposed and interconnected. Hence, one subpixel may affect the another subpixel. This is lateral leakage. Alternately expressed, lateral leakage is a crosstalk phenomenon that occurs between adjacent OLED elements sharing a hole transfer layer. Accordingly, $V_{dd}-V_{data}(p)$ may be added to $V_{res}(\overline{p})$ in order to accurately reflect this phenomenon. It follows that, $V_{dd}-\Delta V_{data_c}(p_c)$. may be expressed by $\Delta V_{data_c}(p_c)$.

Hence, a model of the display panel 200 reflecting both of these characteristics affecting light emission by the OLED may be expressed by Equation 4 below.

$$L_c(\overline{p})=K(\Delta V_{data_c}(Spr_c(\overline{p}))+V_{res_c}(\overline{p})-sV_{drop}\times i_s(\overline{p})^2 \quad \text{<Equation 4>}$$

Of further note, Equation 4 corresponds to the model of the display panel 200 related to brightness information for c channel. Here, $spr_c(\overline{p})$ may be obtained by outputting only the c channel value with respect to the sample pixel value ($\overline{p}$). For example, $spr_c(\overline{p})$ may be $p_g$.

The calculating device 320 may calculate parameter values (para) shown in Equation 4. That is, the calculating device 320 may be used to generate various parameter values (para) including $M_{pri}$, $\Delta V_{data_c}(p_c)$, $V_{res_c}(\overline{p})$, $sV_{drop}$, $i_s(\overline{p})$ based on the measured color coordinate value msr ($\overline{p}$).

Referring to Equation 1, the calculating device 320 may receive the measured color coordinate value msr ($\overline{p}$). That is, mX, mY and mZ which are the tristimulus values of each color may be sent to the calculating device 320. $M_{pri}$ may be derived through the measured color coordinate value msr ($\overline{p}$), and the brightness information $mL_c(\overline{p})$ may be output according to Equation 5 below. That is, the brightness information $mL_c(\overline{p})$ may be generated on the basis of $M_{pri}$ and the measured color coordinate value msr ($\overline{p}$). Here, the brightness information $mL_c(\overline{p})$ denotes the brightness component for the c channel.

$$\begin{bmatrix} mL_r(\overline{p}) \\ mL_g(\overline{p}) \\ mL_b(\overline{p}) \end{bmatrix} = M_{pri}^{-1} \times msr(\overline{p}) \quad \text{<Equation 5>}$$

Furthermore, $i_s(\overline{p})$ may be derived according to Equation 6 below.

$$i_s(\overline{p}) = \begin{bmatrix} cw_r & cw_g & cw_g \end{bmatrix} \times \begin{bmatrix} mL_r(\overline{p}) \\ mL_g(\overline{p}) \\ mL_b(\overline{p}) \end{bmatrix} \quad \text{<Equation 6>}$$

Thus, $i_s(\overline{p})$ may be generated based on the brightness information $mL_c(\overline{p})$. Here, $cw_c$ denotes a current weighted value for each channel, and $cw_c$ is a constant value that may be experimentally determined. It follows that, $i_s(\overline{p})$ may be calculated using the measured color coordinate value msr ($\overline{p}$).

Subsequently, the calculating device 320 may calculate $sV_{drop}$ according to Equation 7 below.

$$sV_{drop} = \frac{\Delta v_{drop}}{\Delta i_s} = (V_c(pr_c(\overline{p}))-V_c(\overline{p}))/(i_s(\overline{p})-i_s(pr_c(\overline{p}))) \quad \text{<Equation 7>}$$

$sV_{drop}$ may be predicted as an average of $sV_{drop}$ calculated by all the measured data or some measured data (e.g., the measured color coordinate value msr ($\overline{p}$)) according to Equation 7. In Equation 7, $\overline{p}$ and $pr_c(\overline{p})$ may be derived from the sample pixel value ($\overline{p}$) of FIG. 7. Further, the values $v_c(pr_c(\overline{p}))$ and $v_c(\overline{p})$ of Equation 7 may be calculated according to Equation 8 below, wherein $pr_c(\overline{p})$ denotes a value in which only the components of the c channel are maintained in $\overline{p}$ and the values of the other channels are limited to 0.

$$V_c(\overline{p}) = \exp\left(\frac{1}{2}(\ln(mL_c(\overline{p}))-\ln(K))\right) \quad \text{<Equation 8>}$$

It follows that, the calculating device 320 may calculate $i_s(\overline{p})$ and $sV_{drop}$, using the measured color coordinate value msr ($\overline{p}$). That is, the calculating device 320 may generate a parameter value (para) including $i_s(\overline{p})$ and $sV_{drop}$.

Subsequently, $\Delta V_{data_c}(p_c)$ and $V_{res_c}(\overline{p})$ may be calculated according to Equations 9 and 10 below. Here, $v(p_c)$ is a primary pixel in which only the c channel is a pixel value $p_c$ and other channels are limited to 0.

$$\Delta V_{data_c}(p_c)=V_c(v(p_c))+sV_{drop}\times i_s(V(P_c)) \quad \text{<Equation 9>}$$

$$V_{res_c}(\overline{p})=v_c(\overline{p})-\Delta V_{data_c}(spr_c(\overline{p}))+sV_{drop}\times i_s(\overline{p}) \quad \text{<Equation 10>}$$

Referring to Equation 9, $\Delta V_{data_c}(p_c)$ may be calculated using the previously derived $V_c(\overline{p})$, $i_s(\overline{p})$ and $sV_{drop}$. Also, referring to Equation 10, $V_{res_c}(\overline{p})$ may be predicted to be the remaining value by referring to Equation 9.

Thus, the calculating device 320 may generate the parameter value (para) including $M_{pri}$, $\Delta V_{data_c}(P_c)$, $V_{res_c}(\overline{p})$, $sV_{drop}$, $is(\overline{p})$, using the measured color coordinate value msr ($\overline{p}$). Referring back to FIG. 5, the calculating device 320 may provide the generated parameter values (para) to the memory device 330, and the memory device 330 may store same.

Figure 10:
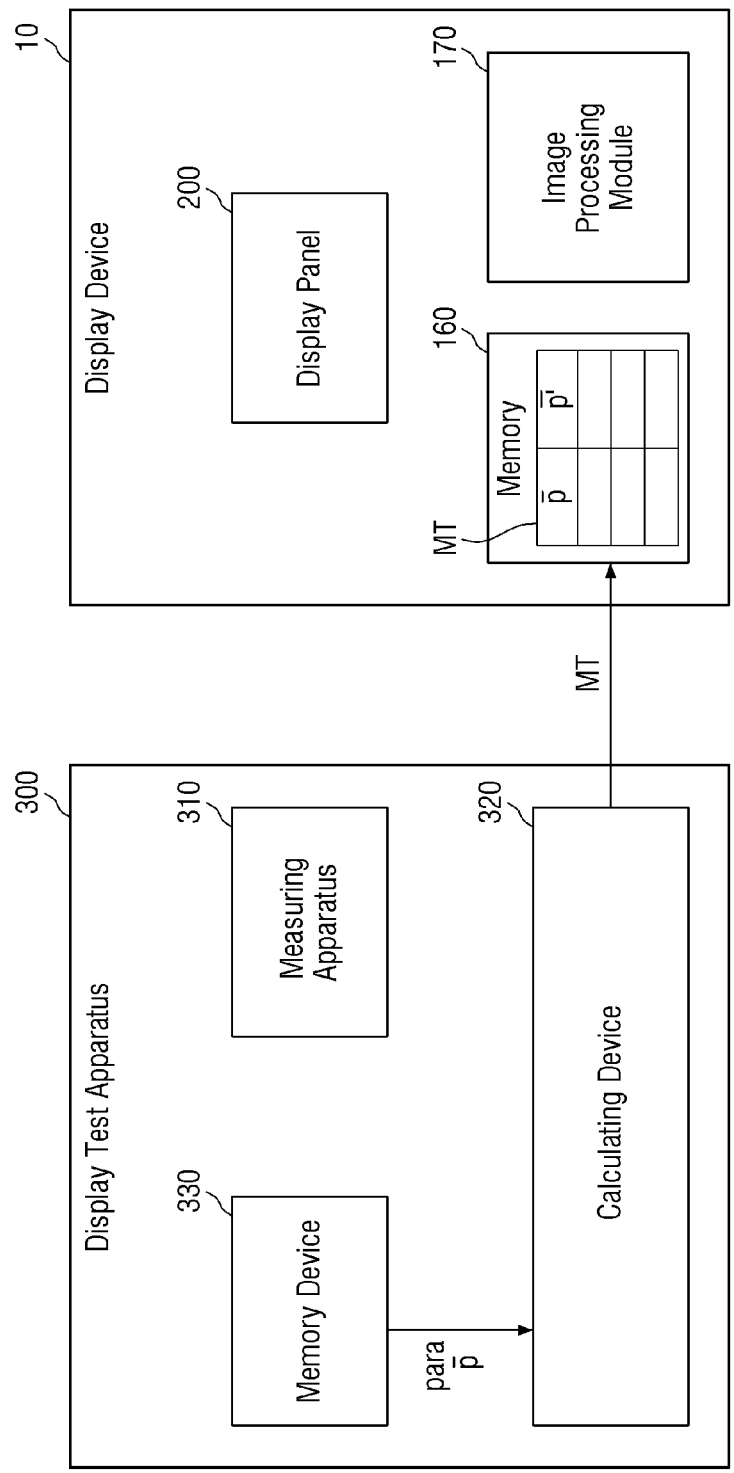
Figure 11:
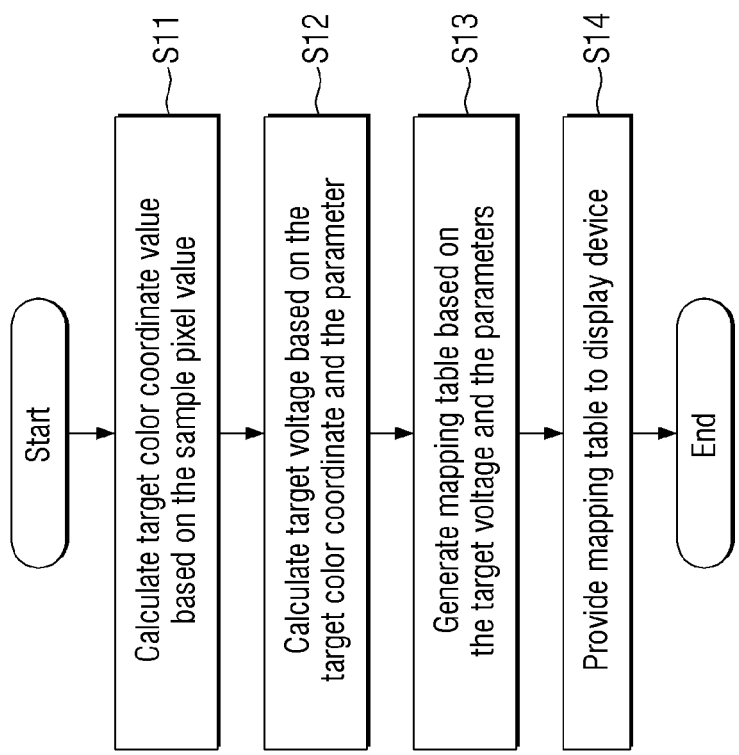
Figure 12:
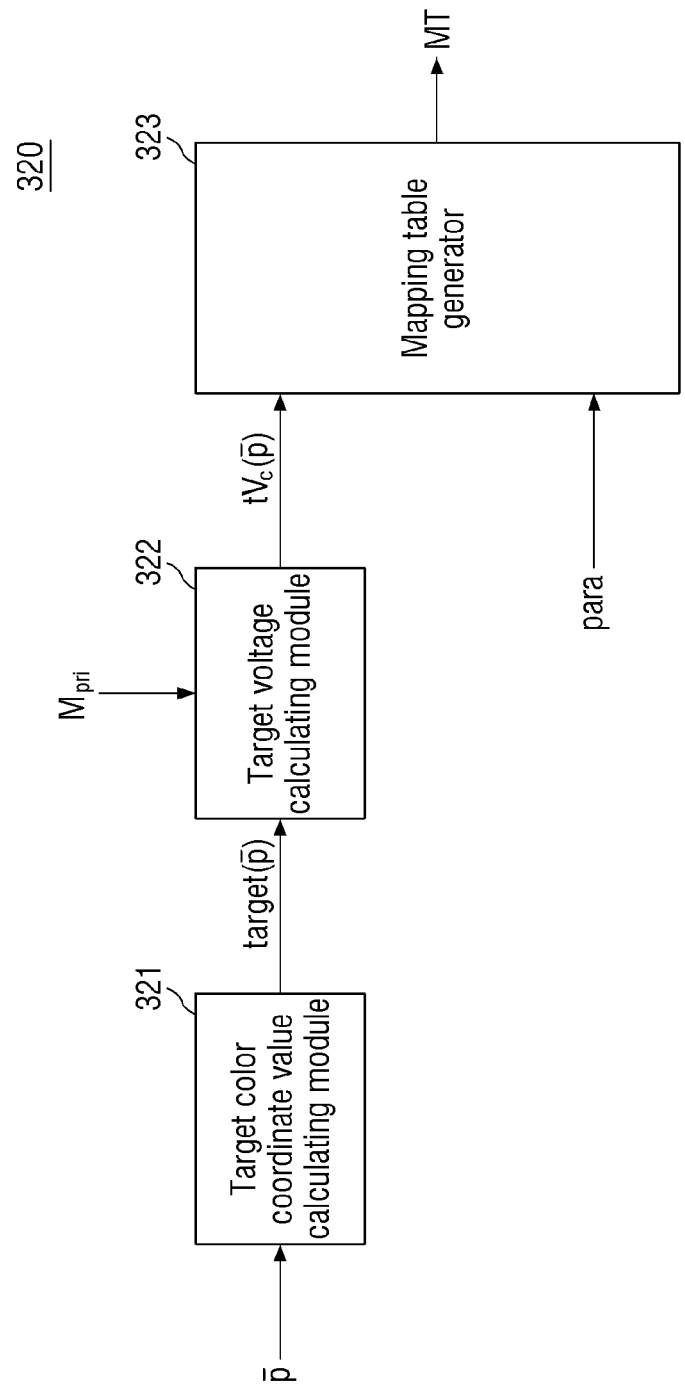
Figure 13:
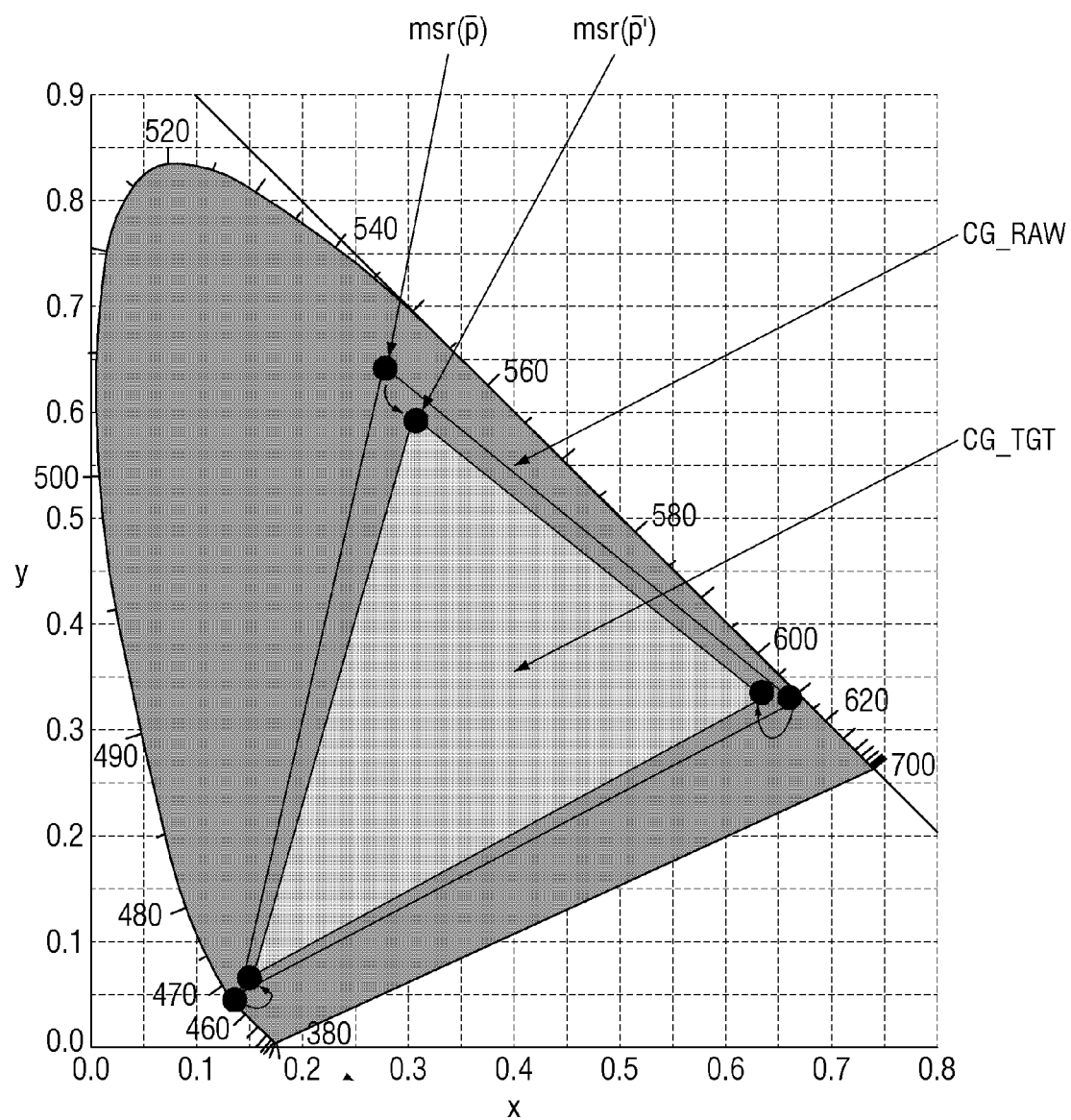

Hereafter, generation of the mapping table MT by a display test apparatus 300 according to embodiments of the inventive concept will be described in relation to FIGS. 10, 11, 12 and 13, wherein FIG. 10 is a block diagram of the display test apparatus 300, FIG. 11 is a flowchart illustrating operation of the display test apparatus 300, FIG. 12 is a block diagram further illustrating the calculating device of FIG. 10, and FIG. 13 is a conceptual diagram illustrating an exemplary color coordinate correction.

Referring to FIGS. 10 and 11, the calculating device 320 may be used to calculate the target color coordinate value target($\bar{p}$) based on the sample pixel value ($\bar{p}$) (S11). Here, the target color coordinate value target($\bar{p}$) may be expressed by Equation 11 below.

$$\begin{bmatrix} tX \\ tY \\ tZ \end{bmatrix} = \text{target}(\bar{p}) \qquad \langle \text{Equation 11} \rangle$$

The target color coordinate value target($\bar{p}$) may include tX, tY and tZ, which are the tristimulus values of each channel. The sample pixel value ($\bar{p}$) to be input here may be the same as the sample pixel value ($\bar{p}$) used for the measured color coordinate value target($\bar{p}$). That is, the calculating device 320 may derive both the color coordinate value msr ($\bar{p}$) and the target color coordinate value measure target($\bar{p}$), using the same sample pixel value ($\bar{p}$). Here, the target color coordinate value target($\bar{p}$) is included in the standard color gamut. That is, the target color coordinate value target($\bar{p}$) means a target value that the sample pixel value ($\bar{p}$) tries to display. That is, the measured color coordinate value msr ($\bar{p}$) and the target color coordinate value target($\bar{p}$) may be different from each other, and a process of correcting this may be required.

Referring to FIG. 13, the measured color coordinate value msr ($\bar{p}$) may be included in the low color gamut CG_RAW and a corrected measured color coordinate value msr ($\bar{p}$) may be included in the target color gamut CG_TGT. Here, the target color gamut CG_TGT may correspond to the standard color gamut. In the inventive concept, a mapping table MT that matches the measured color coordinate value msr ($\bar{p}$) with the corrected measured color coordinate value msr ($\bar{p}$') may be generated.

Referring to FIG. 12, the calculating device 320 may include a target color coordinate value calculating module 321, a target voltage calculating module 322, and a mapping table generator 323.

The target color coordinate value calculating module 321 may calculate the target color coordinate value target($\bar{p}$) based on the sample pixel value ($\bar{p}$). The target color coordinate value target($\bar{p}$) may be calculated using the Equation 11.

The target voltage calculating module 322 may calculate the target voltage tV$_c$($\bar{p}$) on the basis of the generated target color coordinate value target($\bar{p}$) and parameter (para) (S12). The target voltage tV$_c$($\bar{p}$) may be calculated using Equations 12 and 13 below.

$$\begin{bmatrix} tL_r(\bar{p}) \\ tL_g(\bar{p}) \\ tL_b(\bar{p}) \end{bmatrix} = M_{pri}^{-1} \times \text{target}(\bar{p}) \qquad \langle \text{Equation 12} \rangle$$

$$tV_c(\bar{p}) = \exp\left(\frac{1}{2}(\ln(tL_c(\bar{p})) - \ln(K))\right) \qquad \langle \text{Equation 13} \rangle$$

That is, the target voltage calculating module 322 may derive the brightness information tL$_c$ ($\bar{p}$) according to the sample pixel value ($\bar{p}$) from the target color coordinate value target($\bar{p}$), using Equation 12. Further, the target voltage calculating module 322 may derive the target voltage tV$_c$($\bar{p}$) that outputs the brightness corresponding to the brightness information tL$_c$($\bar{p}$), using Equation 13. The target voltage calculating module 322 may provide the target voltage tV$_c$($\bar{p}$) to the mapping table generator 323.

The mapping table generator 323 may generate a mapping table MT on the basis of the target voltage tV$_c$($\bar{p}$) and parameters (para) (S13).

Using Equation 14 below, the mapping table generator 323 may calculate the converted pixel value ($\bar{p}$') that outputs the target voltage tV$_c$($\bar{p}$). Here, converted pixel value ($\bar{p}$') may be {p'$_r$, p'$_g$, P'$_b$}. Hence, the converted pixel value ($\bar{p}$') that satisfies Equation 14 may be derived, and the mapping table MT may be understood as information on the converted pixel value ($\bar{p}$') matched with the sample pixel value ($\bar{p}$). The mapping table MT may be a pair of sample pixel values ($\bar{p}$) and converted pixel values ($\bar{p}$') that satisfy Equation 14.

$$tV_c(\bar{p}) = \Delta V_{data_c}(spr_c(\bar{p}')) + V_{res_c}(\bar{p}') - sV_{drop} \times i_s(\bar{p}') \qquad \langle \text{Equation 14} \rangle$$

Here, the sample pixel value ($\bar{p}$) may include only part of the pixel values described in relation to FIG. 7. That is, the sample pixel value ($\bar{p}$) may not include all the pixel values. When performing a search for a pixel value not included in the sample pixel value ($\bar{p}$), there may be a need for parameters (para) of the color coordinate value not included in the measured color coordinate value.

Figure 14:
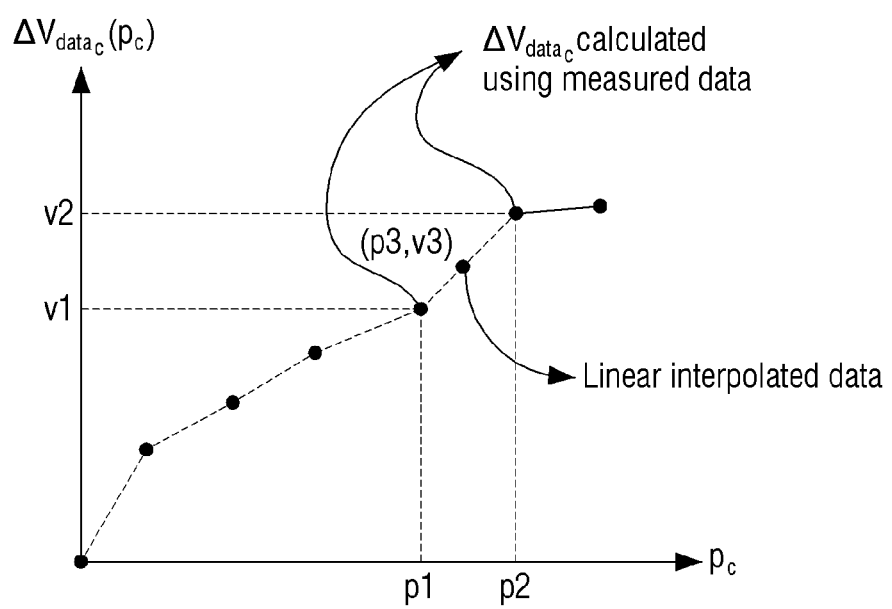
FIGS. 14 and 15 are respective conceptual diagrams illustrating a method of parameter interpolation that may be used related to embodiments of the inventive concept.
Figure 15:
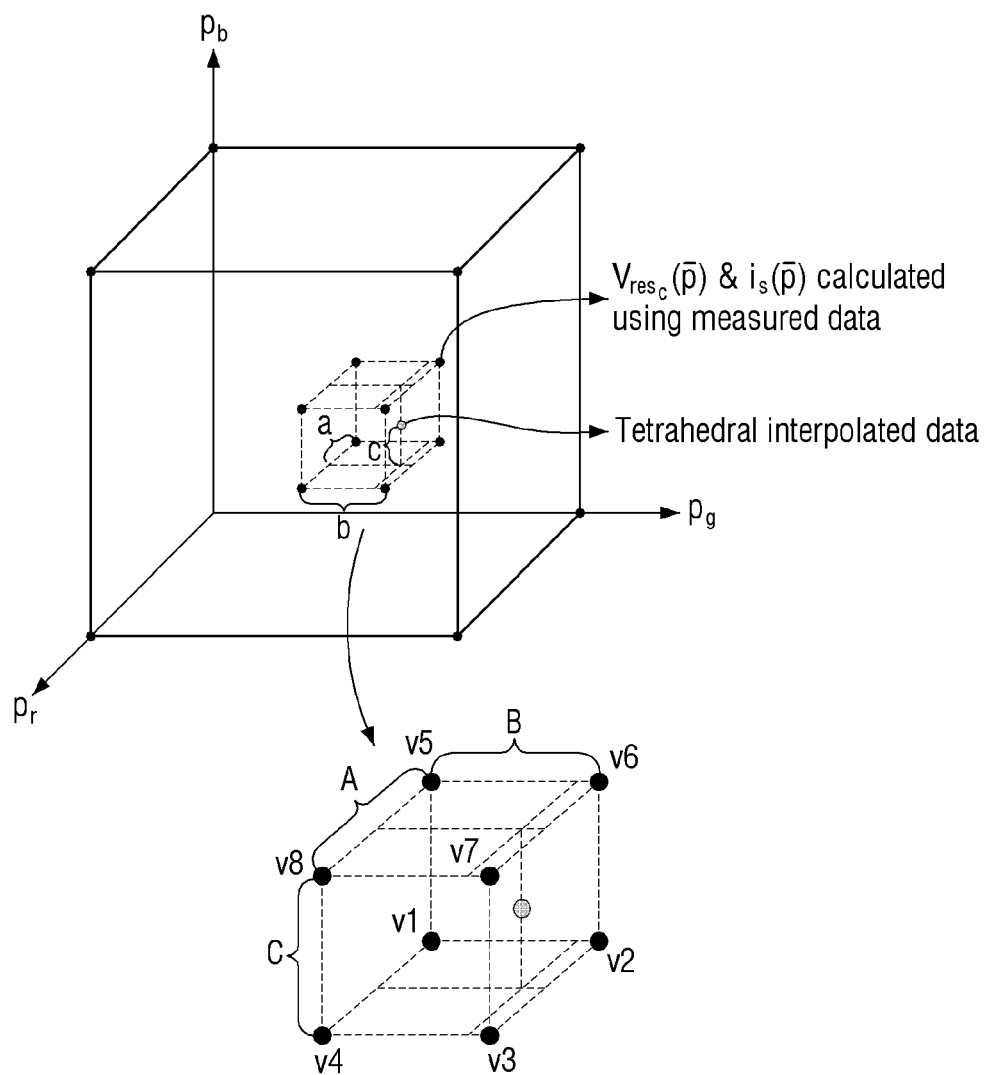

FIGS. 14 and 15 are respective conceptual diagrams illustrating an interpolation approach that may be used in the derivation of certain parameter(s).

Referring to FIG. 14, a first pixel value p1 and the second pixel value p2 in the sample pixel value ($\bar{p}$) correspond to v1 and v2 in $\Delta V_{data_c}(p_c)$. At this time, the calculating device 320 may predict v3 of a third pixel value p3 through a linear interpolation. One possible prediction method is expressed by Equation 15 below, wherein $\Delta V_{data_c}(p_c)$ may be predicted even if the sample pixel value ($\bar{p}$) is not large.

$$v3 = v1 + \frac{v2 - v1}{p2 - p1} \times (p3 - p1) \qquad \langle \text{Equation 15} \rangle$$

Referring to FIG. 15, sample pixel values ($\bar{p}$) (e.g., p1 to p8) correspond to v1 to v8 including $V_{res_c}(\bar{p}')$ and is($\bar{p}$). The calculating device 320 may predict $V_{res_c}(\bar{p}')$ and $i_s(\bar{p})$ of pixel value different from the sample pixel value ($\bar{p}$) through a tetrahedral interpolation.

Referring back to FIG. 10, the calculating device 320 may provide the mapping table MT to the display device 10 (S14). The display device 10 may store the mapping table MT in the memory 160. Here, the mapping table MT may be stored in a non-volatile memory. The mapping table MT may include the sample pixel value ($\bar{p}$), and a converted pixel value ($\bar{p}$') corresponding thereto. Here, when the sample pixel value ($\bar{p}$) is input to the display device 10, the sample pixel value ($\bar{p}$) may be converted into the converted pixel value ($\bar{p}$').

As described above, during the testing of the display device 10, the display test apparatus 300 may measure the image output by the sample pixel value ($\bar{p}$) to generate the measured color coordinate value msr ($\bar{p}$), and may generate the mapping table MT using the same. The display test apparatus 300 may generate the sample pixel value ($\bar{p}$) and the measured color coordinate value msr ($\bar{p}$) once, and then generate the mapping table MT using the same, thereby reducing overall processing time.

Further, referring to Equations 12, 13 and 14, the calculating device 320 may generate the mapping table MT using the target voltage tV$_c$($\bar{p}$). This may generate a more accurate mapping table MT, by utilizing the target voltage tV$_c$($\bar{p}$), unlike the conventional method.

Figure 16:
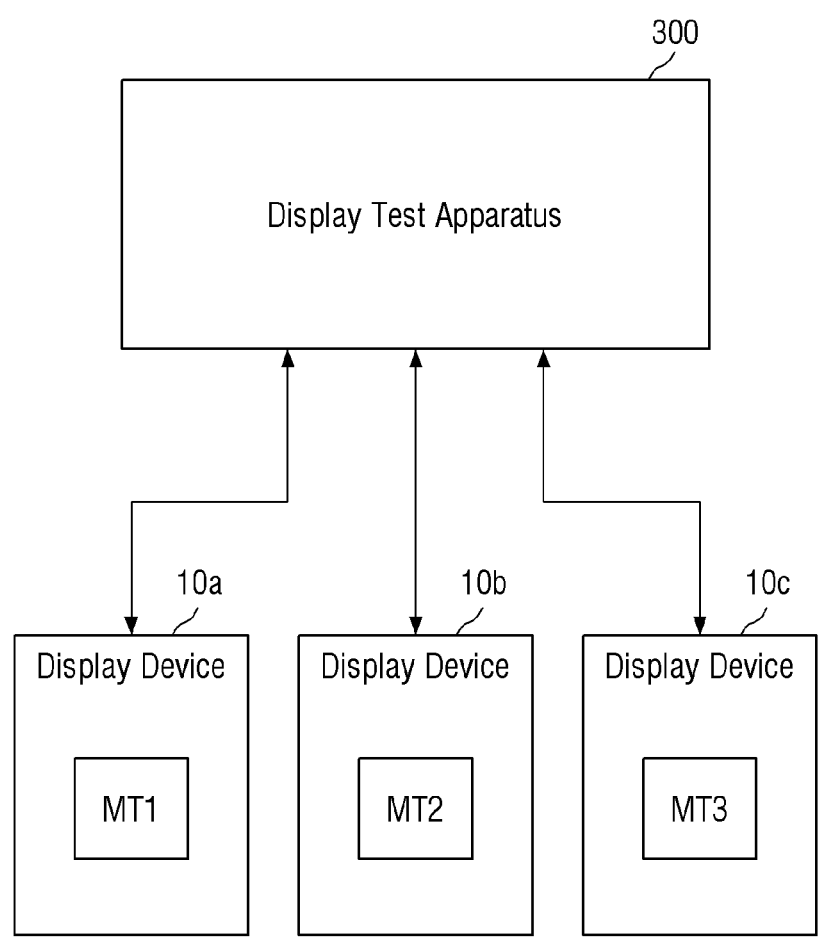
FIG. 16 is a block diagram illustrating a testing method for display devices according to embodiments of the inventive concept.

FIG. 16 is a block diagram illustrating a testing method for a plurality of display devices according to embodiments of the inventive concept.

Referring to FIG. 16, the display test apparatus 300 may be configured to accommodate and test a plurality of display devices (e.g., 10a, 10b and 10c), wherein each of the display devices 10a, 10b and 10c is a different (e.g., a separate and distinct) device. In some embodiments, each of the plurality of display devices 10a, 10b and 10c may include a OLED display panel having potentially different characteristics.

Thus, the display test apparatus 300 may provide respective mapping tables (e.g., MT1, MT2, and MT3) corresponding to the plurality of display devices 10a, 10b and 10c. That is, the display test apparatus 300 may provide a first display device 10a with a first mapping table MT1, a second display device 10b with a second mapping table MT2, and a third display device 10c with a third mapping table MT3, wherein each of the mapping tables MT1, MT2, and MT3 may be different mapping tables.

Accordingly, one or more first parameter(s) (para) calculated in relation to the generation of the first mapping table MT1, one or more second parameter(s) (para) calculated in relation to the generation of the second mapping table MT2, and one or more third parameter(s) (para) calculated in relation to the generation of the third mapping table MT3 may be different or the same.

Thus, the OLED display panels being tested by the display test apparatus 300 may exhibit different characteristics on a display device-by-display device basis. For example, a raw color gamut CG_RAW for the display panel of the first display device 10a may be different from the raw color gamut CG_RAW for the display panel of the second display device 10b and/or the display panel of the third display device 10c. Accordingly, the display test apparatus 300 may generate different mapping tables MT1, MT2, and MT3 suitable for the respective display panels of the different display devices 10a, 10b and 10c, and may thereafter provide each corresponding mapping table to its corresponding display devices 10a, 10b and 10c. In this manner, color realization performance for each one of the display devices 10a, 10b and 10c may be particularly improved.

Each one of the plurality of display devices 10a, 10b and 10c may be tested by the display test apparatus 300 over a number of different testing periods. For example, the measuring apparatus 310 may measure the first display device 10a during a first time period, and the calculating device 320 may generate and generate the first mapping table MT during a second time period following the first time period.

Further, the measuring apparatus 310 may measure the second display device 10b during a third time period following the second time period, and the calculating device 320 may generate the second mapping table MT during a fourth time period following the third time period. In this manner, the display test apparatus 300 may perform each test within a relatively short time period, thereby reducing overall testing time.

Figure 17:
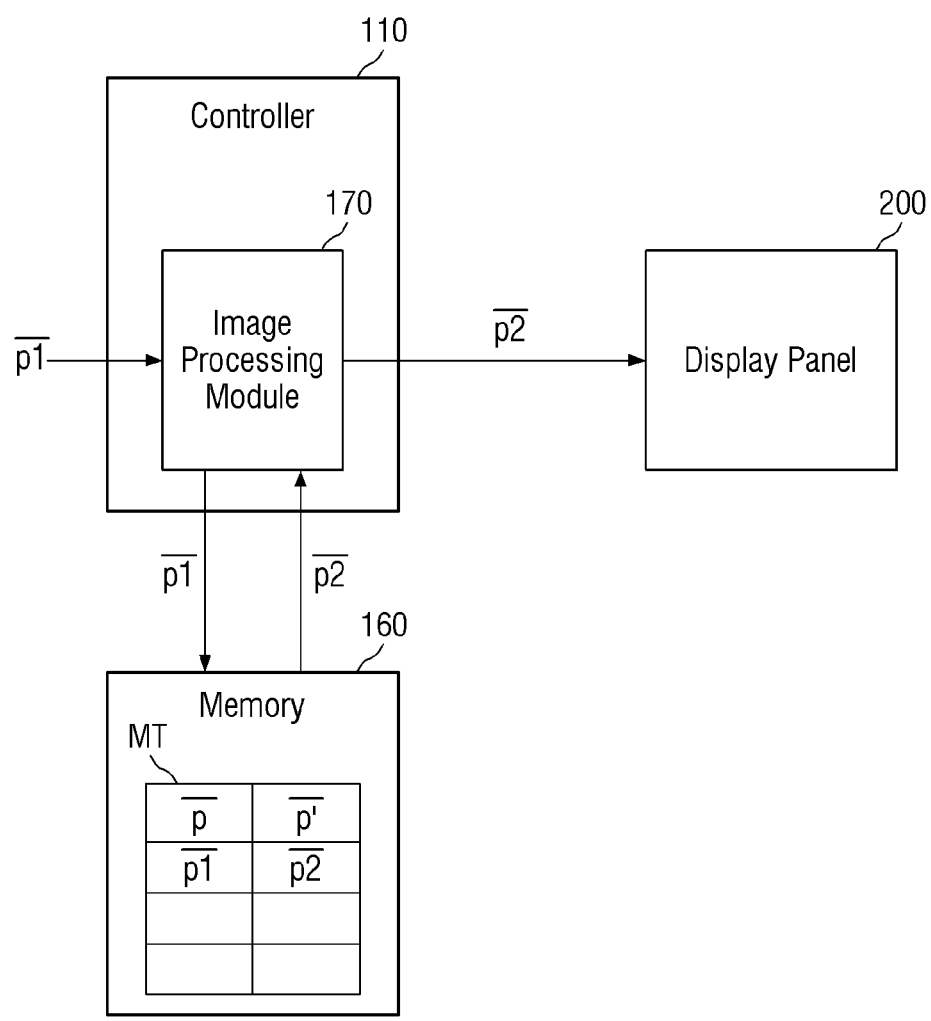
FIG. 17 is a block diagram illustrating operation of the display device 10 according to embodiments of the inventive concept.
Figure 18:
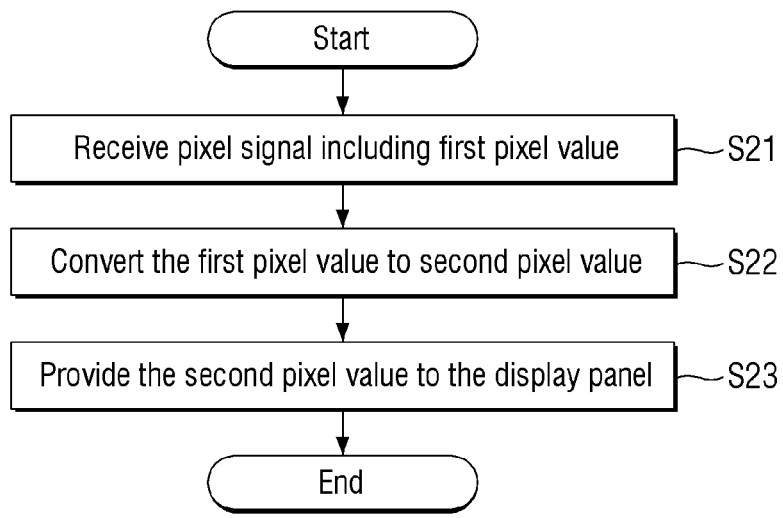
FIG. 18 is a flowchart illustrating operation of the display device of FIG. 17.

FIG. 17 is a block diagram further illustrating in one embodiment operation of the display device 10 according to embodiments of the inventive concept, FIG. 18 is a flowchart illustrating in one embodiment a method operation for the display device 10 of FIG. 17.

Referring to FIGS. 17 and 18, the image processing module 170 of the display device 10 may receive a pixel signal including the first pixel value $\overline{p1}$ (S21). The pixel signal may be sent from the processor 50. The pixel signal may correspond to the first image data DATA1 of FIG. 3.

The display device 10 may convert the first pixel value $\overline{p1}$ into the second pixel value $\overline{p2}$ (S22). The image processing module 170 may access the memory 160 by utilizing the first pixel value $\overline{p1}$. The mapping table MT stored in the memory 160 may include data of the first pixel value $\overline{p1}$ and the second pixel value $\overline{p2}$ corresponding to the first pixel value $\overline{p1}$. The image processing module 170 may receive the second pixel value $\overline{p2}$ as a result of accessing the mapping table MT. That is, the image processing module 170 may read the second pixel value $\overline{p2}$ from the memory 160.

The controller 110 may provide the second pixel value $\overline{p2}$ to the display panel 200 (S23). As a result, the display device 10 may convert the first pixel value $\overline{p1}$ into the second pixel value $\overline{p2}$ by utilizing the mapping table MT. Further, the image that is output to the display panel 200 may be an image generated in response to the second pixel value $\overline{p2}$. The second pixel value $\overline{p2}$ may correspond to the second image data DATA2 of FIG. 3.

Figure 19:
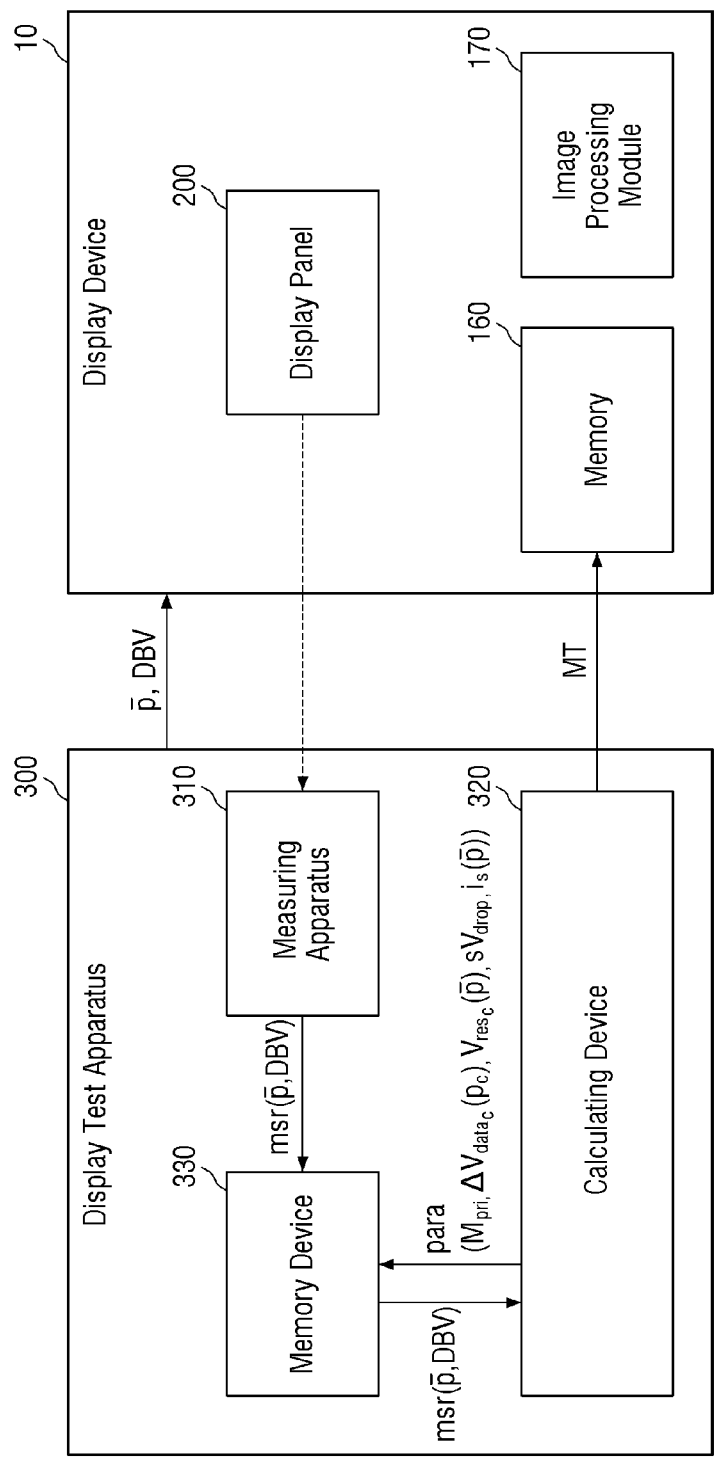
FIGS. 19 and 20 are respective block diagrams illustrating a display test apparatus testing a display device according to embodiments of the inventive concept.

FIG. 19 is a block diagram illustrating in another embodiment the display test apparatus 300 testing the display device 10 according to embodiments of the inventive concept. Hereinafter, only material differences between the display test apparatus and display device of FIG. 19 and the preceding embodiments will be highlighted.

Referring to FIG. 19, the display test apparatus 300 may provide the display device 10 with a sample pixel value ($\overline{p}$) and a display brightness value DBV. The display brightness value DBV may include the brightness information of the display panel 200 of the display device 10. That is, when the brightness value DBV of the display is small, the brightness of the display panel 200 that is output in response thereto may be low, and when the display brightness value DBV is large, the brightness of the display panel 200 that is output in response thereto may be high.

The measuring apparatus 310 may generate a measured color coordinate value msr ($\overline{p}$, DBV) on the basis of the image of the display panel 200 that is output in response to the sample pixel value ($\overline{p}$) and the display brightness value DBV. The measured color coordinate value msr ($\overline{p}$, DBV) may be provided to the calculating device 320. The calculating device 320 may generate a parameter (para) on the basis of the measured color coordinate value msr ($\overline{p}$, DBV), and generate the mapping table MT on the basis of the measured color coordinate value msr ($\overline{p}$, DBV) and the parameter (para). As the display test apparatus 300 considers not only the sample pixel value ($\overline{p}$) but also the display brightness value DBV, the color realization performance of the display device 10 may be further improved.

Figure 20:
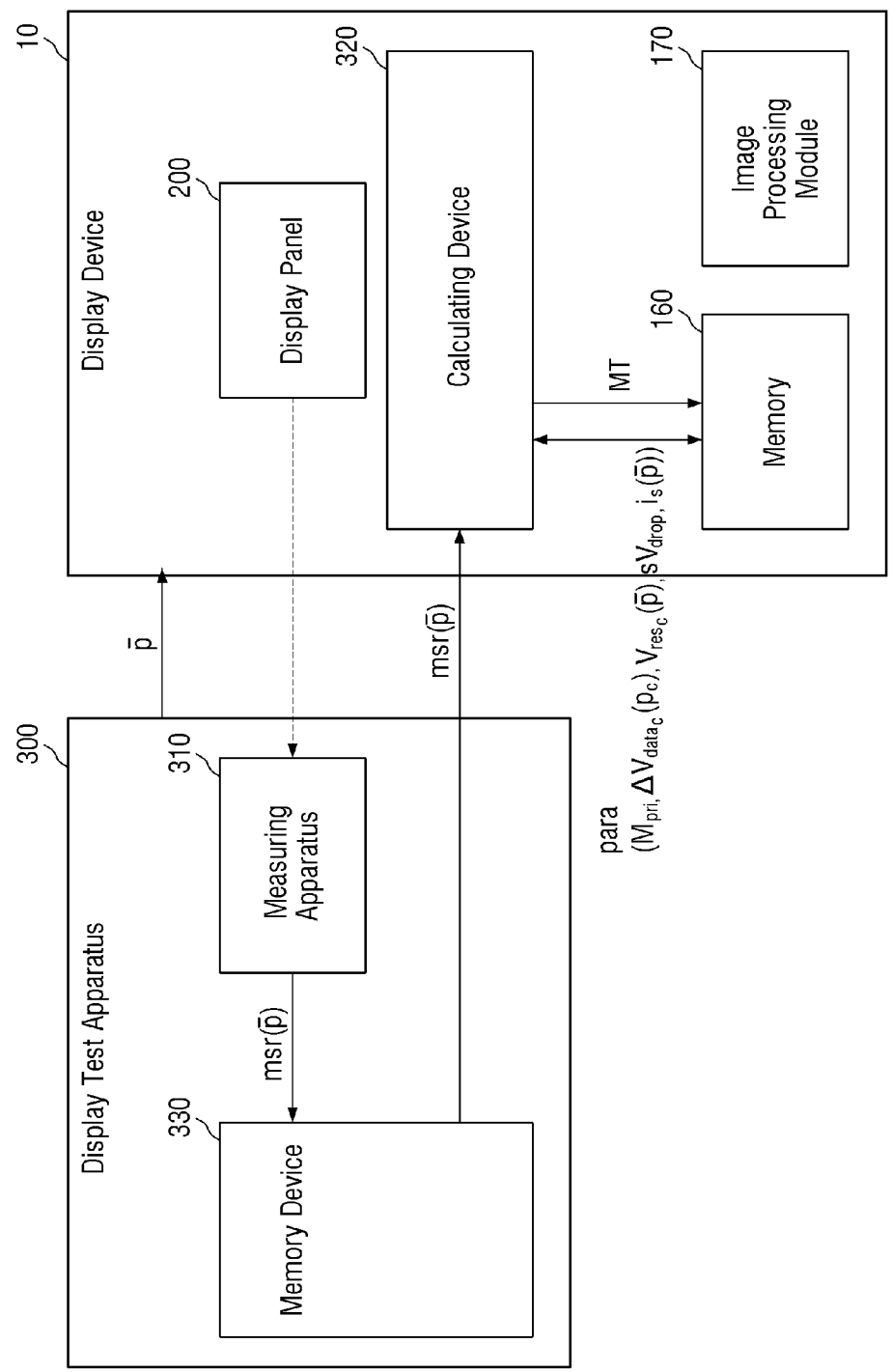

FIG. 20 is a block diagram further illustrating the display device 10 being tested by the display device 300 according to embodiments of the inventive concept.

Hereinafter, only material differences between the display test apparatus and display device of FIG. 20 and the preceding embodiments will be highlighted.

Referring to FIG. 20, the display test apparatus 300 may include a measuring apparatus 310 and a memory device 330, but may not include a calculating device 320. In contrast to the preceding embodiments of the display test apparatus 300, the display test apparatus 300 of FIG. 20 need not perform the calculations necessary to generate a mapping table MT.

Rather, the display test apparatus 300 may provide the display device 10 with the measured color coordinate value msr ($\overline{p}$) measured through the measuring apparatus 310, and the display device 10 may include the calculating device 320, wherein the calculating device 320 may receive the measured color coordinate value msr ($\overline{p}$).

The calculating device 320 included in the display apparatus 10 may perform a calculating operation based on the measured color coordinate value msr ($\overline{p}$). For example, the calculating device 320 may generate the mapping table MT based on the measured color coordinate value msr $(\bar{p})$ and provide it to the memory 160.

Here, the display test apparatus 300 may generate the measured color coordinate value msr $(\bar{p})$ within a shorter time, and provide the measured color coordinate value msr $(\bar{p})$ to the display device 10, thereby reducing the test time of the display device 10.

Further, since the mapping table MT is generated inside the display device 10, the fabricating time of the display device 10 may be reduced.

Figure 21:
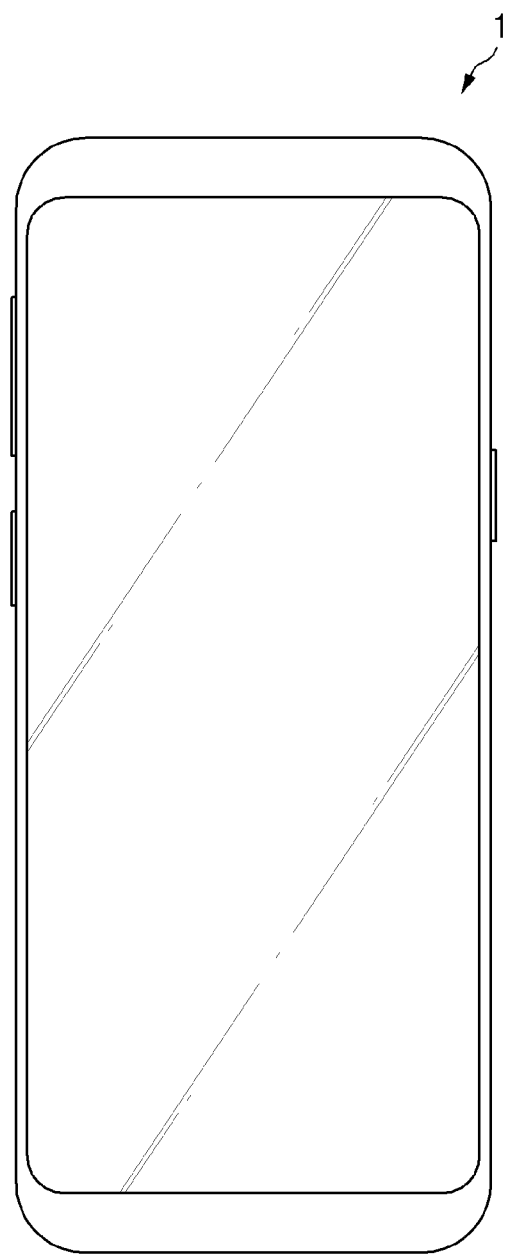
FIGS. 21 and 22 are perspective diagrams illustrating exemplary electronic devices that may incorporate a display device according to embodiments of the inventive concept.
Figure 22:
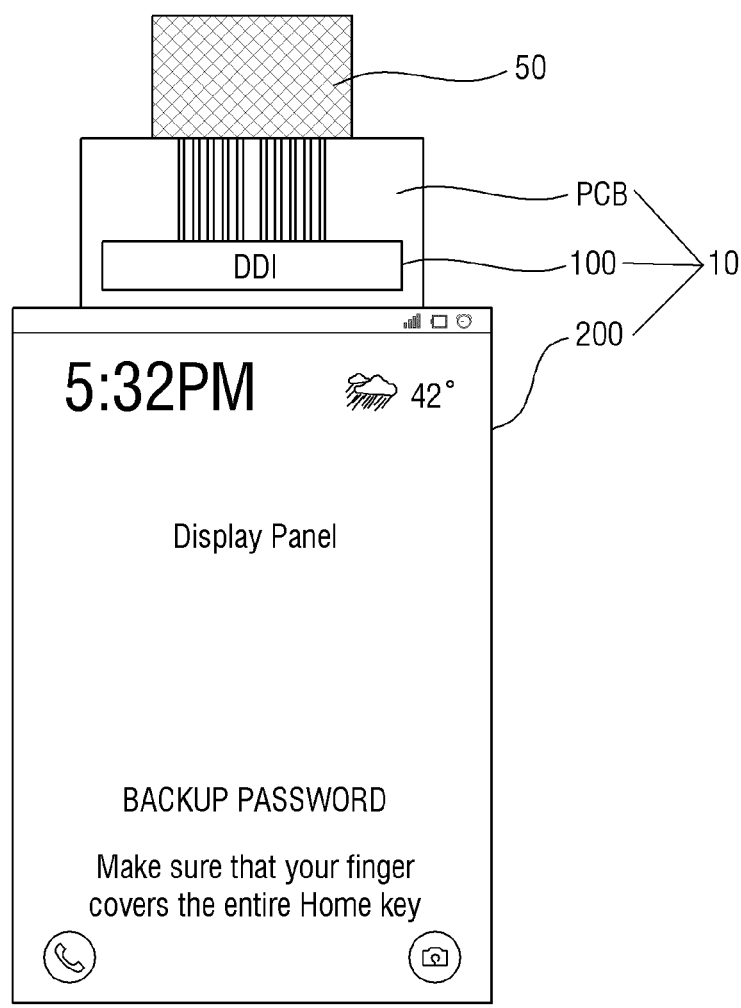

FIGS. 21 and 22 are respective diagrams illustrating electronic devices that may incorporate a display device according to embodiments of the inventive concept.

FIG. 21 shows the electronic device 1 integrally incorporating (e.g., mounting) the display device 100. Although FIG. 21 is shown as smartphone, the electronic device 1 may otherwise configured (e.g., a TV, a PC, a tablet PC, etc.).

FIG. 22 shows a display device 10 and a processor 50 included in the electronic device 1.

The display device 10 may include a display panel 200, a display drive device 100 and a printed circuit board (PCB). The display panel 200, the display drive device 100, and the processor 50 may be connected to each other through the PCB.

In some embodiments, if the electronic device 1 is a mobile device, the PCB substrate (PCB) may be a flexible PCB. The flexible PCB may be folded, and the display drive 100 and the processor 50 may be attached thereto. The display drive 100 and the processor 50 may be disposed on a back side of the display panel 200, when the flexible PCB board is folded.

Those skilled in the art will appreciate that many variations and modifications may be made to the illustrated embodiments without departing from the scope of the inventive concept as defined by the following claims.

What is claimed is:

1. A display test apparatus, comprising:
   a measuring apparatus configured to accommodate a first display device including a first display panel and a second display device including a second display panel; and
   a calculating device connected to the measuring apparatus,
   wherein the measuring apparatus is further configured to provide a sample pixel value to the first display device and the second display device, measure a first color coordinate value associated with a first display image of the first display panel in response to the sample pixel value, and measure a second color coordinate value associated with a second display image of the second display panel in response to the sample pixel value, and
   the calculating device is further configured to generate a first parameter of the first display panel in response to the first color coordinate value, generate a second parameter, different from the first parameter, of the second display panel in response to the second color coordinate value, generate a target color coordinate value in response to the sample pixel value, generate a first mapping table in response to the first color coordinate value, the first parameter and the target color coordinate value, and generate a second mapping table, different from the first mapping table, in response to the second color coordinate value, the second parameter, and the target color coordinate value.

2. The display test apparatus of claim 1, wherein the calculating device is further configured to provide the first mapping table to the first display device, and provide the second mapping table to the second display device.

3. The display test apparatus of claim 1, wherein the measuring apparatus measures the first color coordinate value during a first time period, and
   the calculating device generates the first mapping table during a second time period following the first time period.

4. The display test apparatus of claim 3, wherein the measuring apparatus measures the second color coordinate value during a third time period following the second time period, and
   the calculating device generates the second mapping table during a fourth time period following the third time period.

5. The display test apparatus of claim 1, wherein the first mapping table includes a first converted pixel value corresponding to the sample pixel value, the second mapping table includes a second converted pixel value, different from the first converted value, corresponding to the sample pixel value.

6. The display test apparatus of claim 1, wherein the measuring apparatus is further configured to provide a display brightness value to the first display device and the second display device, measure the first color coordinate value further in response to the display brightness value, and measure the second color coordinate value further in response to the display brightness value.

7. The display test apparatus of claim 6, wherein the first mapping table includes a first converted pixel value corresponding to the sample pixel value and the display brightness value, and
   the second mapping table includes a second converted pixel value corresponding to the sample pixel value and the display brightness value.

8. The display test apparatus of claim 1, wherein the first color coordinate value is different from the second color coordinate value.

9. The display test apparatus of claim 1, wherein each of the first display panel and the second display panel is one of an organic light emitting display (OLED) panel and a Micro light emitting display (LED) panel.

10. The display test apparatus of claim 1,
    wherein the target color coordinate value is included in a given color gamut.

11. A method of fabricating a display device, the method comprising:
    providing a sample pixel value to a display device including an organic light emitting display (OLED) panel;
    measuring a color coordinate value of a display image generated by the OLED in response to the sample pixel value;
    generating at least one parameter of the OLED panel in response to the color coordinate value;
    generating a target color coordinate value in response to the sample pixel value;
    calculating a target voltage in response to the target color coordinate value and the at least one parameter, wherein the target color coordinate value is included in a given color gamut; and
    generating a mapping table in response to the color coordinate value, the at least one parameter, and the target voltage.

12. The method of claim 11, further comprising:
    providing the mapping table to the display device.

13. The method of claim 11, wherein the mapping table includes a converted pixel value corresponding to the sample pixel value.

14. The method of claim 11, further comprising:
providing a display brightness value to the display device; and
measuring a color coordinate value of a display image generated by the OLED panel in response to the sample pixel value and the display brightness value.

15. A method of fabricating a first display device including a first display panel and a second display device including a second display panel, the method comprising:
during a first time period, providing a first stage of the first display device using a first display process apparatus, testing the first stage of the first display device, and then, providing a final stage of the first display device using a second display process apparatus; and
during a second time period following the first time period, providing a first stage of the second display device using the first display process apparatus, testing the first stage of the second display device, and then, providing a final stage of the second display device using a second display process apparatus,
wherein the testing of the first stage of the first display device includes;
providing a first sample pixel value to the first stage of the first display device, measuring a first color coordinate value of an image displayed by the first display panel in response to the first sample pixel value, providing the first color coordinate value to the first stage of the first display device, generating a first parameter of the first display panel based on the first color coordinate value, generating a first target color coordinate value based on the first sample pixel value, and generating a first mapping table based on the first color coordinate value, the first parameter, and the first target color coordinate value, and
the testing of the first stage of the second display device includes;
providing a second sample pixel value to the first stage of the second display device, measuring a second color coordinate value of an image displayed by the second display panel in response to the second sample pixel value, providing the second color coordinate value to the first stage of the second display device, generating a second parameter of the second display panel based on the second color coordinate value, generating a second target color coordinate value based on the second sample pixel value, and generating a second mapping table based on the second color coordinate value, the second parameter, and the second target color coordinate value.

16. The method of claim 15, wherein the second parameter is different from the first parameter, and
the second mapping table is different from the first mapping table.

17. The method of claim 15, wherein the first mapping table includes a first converted pixel value corresponding to the first sample pixel value,
the second mapping table includes a second converted pixel value corresponding to the second sample pixel value, and
the first converted pixel value is different from the second converted pixel value.

18. The method of claim 17, wherein the first color coordinate value is different from the second color coordinate value.

19. The method of claim 15, wherein each of the first display panel and the second display panel is one of an organic light emitting display (OLED) panel and a Micro light emitting display (LED) panel.

20. The method of claim 15, wherein each one of the first target color coordinate value and the second target color coordinate value is included in a given color gamut.

\* \* \* \* \*